US011664758B2

(12) United States Patent
Madani et al.

(10) Patent No.: US 11,664,758 B2
(45) Date of Patent: May 30, 2023

(54) PHOTOPIEZOELECTRIC PANEL (71) Applicant: University of Louisiana at Lafayette, Lafayette, LA (US)

(72) Inventors: Mohammad R. Madani, Lafayette, LA (US); Michael S. Davis, Lafayette, LA (US)

(73) Assignee: University of Louisiana at Lafayette, Lafayette, LA (US)

( * ) Notice: Subject to any disclaimer, the term of this patent is extended or adjusted under 35 U.S.C. 154(b) by 338 days.

(21) Appl. No.: 17/064,950

(22) Filed: Oct. 7, 2020

(65) Prior Publication Data

US 2021/0111662 A1 Apr. 15, 2021

Related U.S. Application Data

(60) Provisional application No. 62/913,499, filed on Oct. 10, 2019.

(51) Int. Cl.
| | | |
|---|---|---|
| *H02N 2/18* | (2006.01) | |
| *H02S 10/10* | (2014.01) | |
| *H01L 41/187* | (2006.01) | |
| *F21S 8/08* | (2006.01) | |

(52) U.S. Cl.
CPC .......... *H02S 10/10* (2014.12); *H01L 41/1876* (2013.01); *H02N 2/186* (2013.01); *F21S 8/085* (2013.01)

(58) Field of Classification Search
CPC ...... H02N 2/186; H01L 41/1876; H02S 10/10
See application file for complete search history.

(56) References Cited

U.S. PATENT DOCUMENTS

| | | | | |
|---|---|---|---|---|
| 8,901,802 | B1* | 12/2014 | Que | H02N 2/186 |
| | | | | 310/330 |
| 2012/0132256 | A1* | 5/2012 | Sager | H02S 10/10 |
| | | | | 136/248 |
| 2012/0223617 | A1* | 9/2012 | Kim | H02N 2/186 |
| | | | | 977/762 |
| 2016/0087233 | A1* | 3/2016 | Guha | H01L 51/4293 |
| | | | | 438/82 |

(Continued)

FOREIGN PATENT DOCUMENTS

| | | | |
|---|---|---|---|
| KR | 101338597 B1 * | 12/2013 | |
| WO | WO-2011115325 A1 * | 9/2011 | ............. F03D 9/007 |

*Primary Examiner* — J. San Martin
(74) *Attorney, Agent, or Firm* — Kean Miller LLP; Russel O. Primeaux; Lauren Rucinski (57) ABSTRACT

This invention comprises a panel or system of panels. Each panel comprises a top layer, which is comprised of tempered glass that is highly transparent to allow for maximum light wave transmission. These solar light waves are captured by the photovoltaic cell which comprises the second layer of the panel where this solar energy is converted into usable electrical energy. Vibrations experienced by the photopiezoelectric panel due to foot and lightweight vehicle traffic are absorbed by the PZT sheet layer, which is the third layer of the panel where they are converted into usable electrical energy. The fourth and final layer of the panel consists of the connector plate which serves as the hub and interconnection for gathering the generated electrical energies and transmitting them into the modular grid network to be consumed by various load devices, such as streetlights and other power-dependent city infrastructure.

10 Claims, 6 Drawing Sheets

(56) References Cited

U.S. PATENT DOCUMENTS

2016/0181952 A1* 6/2016 Kim ................. H02S 10/10
                                                              310/319
2017/0012430 A1* 1/2017 Gillett ............... H02J 3/381
2021/0099127 A1* 4/2021 Damaraju ........... H02S 10/10

* cited by examiner

FIGURE 6

PHOTOPIEZOELECTRIC PANEL

CROSS REFERENCE TO RELATED APPLICATIONS

This application claims priority to U.S. Provisional Application No. 62/913,499 entitled "Photopiezoelectric Panel" and filed on Oct. 10, 2019.

STATEMENT REGARDING FEDERALLY SPONSORED RESEARCH OR DEVELOPMENT

Not Applicable.

REFERENCE TO A "SEQUENCE LISTING," A TABLE, OR A COMPUTER PROGRAM

Not Applicable.

SUMMARY OF THE INVENTION

The piezoelectric panel comprises a device capable of harnessing both solar and vibrational energies while fitting within a compact package capable of widespread deployment. To capture solar energy and convert this energy into usable electrical energy, the panel comprises a mechanism capable of the photovoltaic effect, such as a solar panel. To capture the vibrational energies created by, for example, pedestrians, the panel comprises a mechanism capable of the piezoelectric effect, such as Lead Zirconate Titanate ("PZT").

DESCRIPTION OF THE DRAWINGS

The drawings constitute a part of this specification and include exemplary embodiments of the PHOTOPIEZO-ELECTRIC PANEL, which may be embodied in various forms. It is to be understood that in some instances, various aspects of the invention may be shown exaggerated or enlarged to facilitate an understanding of the invention. Therefore, the drawings may not be to scale.

BACKGROUND

For modern cities to remain competitive and provide their citizens with high qualities of life, they must fulfill certain basic necessities. These necessities include access to clean water, efficient transportation methods, safety and security, and universal access to energy. Sixty percent of the world's population is projected to reside within urban areas by 2050. The challenge in making this population distribution statistic a reality is in supplying these populations with clean and safe food, clean water, and sufficient energy while still safeguarding economic, environmental, and social sustainability.

One of the most critical components for a city, without which no city can become "smart", is electrical power. Without access to sufficient and reliable energy, it will not be possible to construct and maintain an efficient urban infrastructure with the hardware required to move people and things, with the added desire of collecting data and exchanging information. With environmental protection a critical component to our planet's continued survival, the development of more efficient and sustainable renewable energy technologies are now more important than ever.

This invention addresses the need for cities to have reliable access to electrical power through a device capable of generating electricity via three different inputs: heat, solar, and vibration. The primary energy-generating components of the device are solar and vibration energy, with electrical energy via temperature differential a by-product of the vibrational energy conversion mechanism. The device, referred to as a photopiezoelectric panel, or photokinetic panel, or solarkinetic panel or pad, is a device for integration into sidewalks. The photopiezoelectric panel features photovoltaic cells for capturing solar energy, and a piezoelectric crystal for capturing the vibrational energies of footsteps created when people walk down the sidewalks fabricated from these panels. This device harnesses energy sources that are already present within the city and directs them to become more useful and productive outputs.

Accordingly, one aim of this invention is to create a system which combines multiple energy inputs. Although other prior art may include one or more of these inputs, the current system provides a novel way of combining them. That is, the system as a whole presents a novel method for providing electric power through multiple inputs. Another aim is to provide a structural panel specifically aimed on harnessing the combined energy inputs. The panel may be modular.

DETAILED DESCRIPTION

The potential impact of photopiezoelectric panels on a city's energy usage is substantial. The inventive photopiezoelectric is capable of capturing the energies of four different sources to produce electrical power. The primary electrical energy generation methods are solar followed by piezoelectric via ground pressure. The secondary electrical energy generation methods are vibrational from footsteps and ambient ground and subterranean sources, and heat.

The piezoelectric panel of the current invention comprises a device capable of harnessing both solar and vibrational energies while fitting within a compact package capable of widespread deployment. To capture solar energy and convert this energy into usable electrical energy, the panel comprises a mechanism capable of the photovoltaic effect, such as a solar panel. To capture the vibrational energies created by people walking, the panel comprises a mechanism capable of the piezoelectric effect, such as Lead Zirconate Titanate ("PZT").

In one embodiment, an inorganic compound, PZT is used. PZT is a ceramic perovskite material that exhibits a marked piezoelectric effect by changing shape when exposed to an electric field. PZT is currently the most widely used piezo ceramic in the world due to its physical strength, chemical inertness, tailorability, and comparatively inexpensive manufacturing costs. In addition to being piezoelectric and developing a potential difference across two of its faces when compressed with relative permittivity's ranging from 300 to 3,850, PZT is also pyroelectric. Being pyroelectric, PZT develops a voltage difference across two of its faces when exposed to changing temperature conditions.

Figure 6:
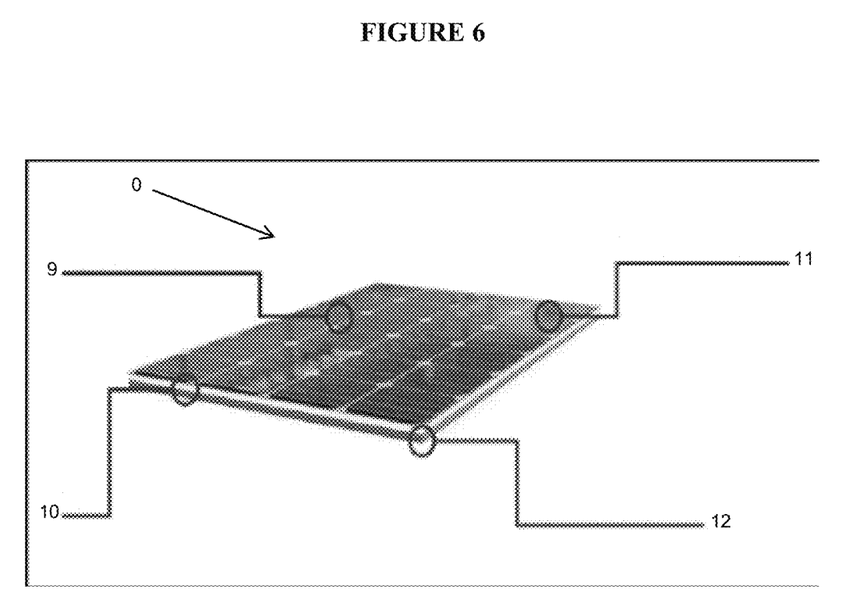
FIG. 6 is an Assembled Photopiezoelectric Panel.

As seen in FIG. 6, the top layer which is comprised of tempered glass 11 is highly transparent to allow for maximum light wave transmission. These solar light waves are captured by the photovoltaic cell 9 which composes the second layer of the panel 0, where this solar energy is converted into usable electrical energy. Vibrations experienced by the photopiezoelectric panel due to foot and lightweight vehicle traffic are absorbed by the PZT sheet layer 10 composing the third layer of the panel where they are converted into usable electrical energy. The fourth and final layer of the panel consists of the connector plate 12 which serves as the hub and interconnection for gathering the generated electrical energies and transmitting them into the modular grid network 3 to be consumed by various load devices, such as streetlights and other power-dependent city infrastructure.

In one embodiment, the device has four methods of power generation. In one or more embodiments, more than or less than four methods of power generation may be used. The primary mode is solar via the solar cells located directly beneath the layer of tempered glass. In the preferred embodiment, the other three methods of power generation come from the layer of PZT.

When compressed from pedestrians exerting ground pressure on the Photopiezoelectric Panel, the PZT will generate AC Power.

PZT also generates AC power when exposed to vibrational energy, such as from ambient ground vibrations that exist within the earth, or from vehicles driving down nearby roadways.

Finally, PZT generates AC power when exposed to temperature differentials. Temperature differentials will exist, for example, when the top of the Photopiezoelectric Panel is exposed to sunlight while the bottom of the Photopiezoelectric Panel is embedded into the ground. A temperature differential exists between the top and bottom surfaces of the Panel as the top will be hotter due to the Sun and the bottom will be cooler due to the bottom of the Panel radiating its heat to the Earth, which acts as an infinitely large heat sink. This difference in temperature will cause the PZT to generate AC power. Temperature differential AC power will generally be small in magnitude relative to the solar and ground pressure methods.

In one embodiment, the photopiezoelectric panel is integrated into a sidewalk; however, other applications exists. Once installed, the panels provide power to, for example, streetlights and other power-requiring infrastructure.

Figure 1:
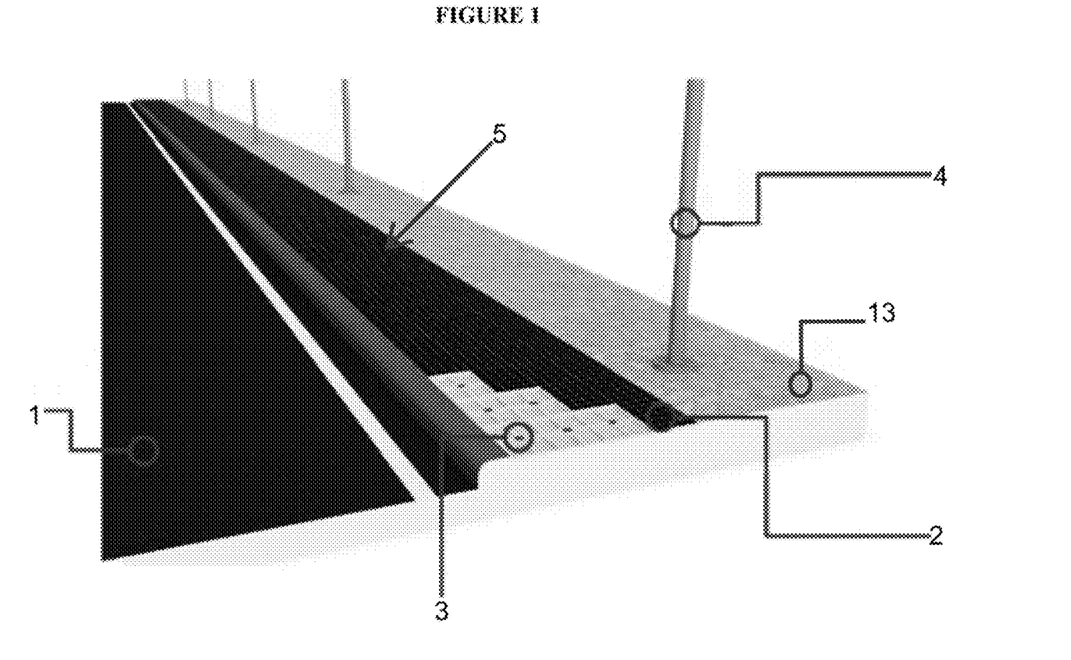
FIG. 1 is a Roadway Cross-Section; Modular Grid Network Visible.

In the preferred embodiment, a modular grid network is installed under the existing sidewalk 13 so that the photopiezoelectric panels replace the sidewalk's top layer. FIG. 1 shows a rendering of a roadway 1 cross-section with photopiezoelectric panels 2 and the modular grid network 3 visible. A panel sidewalk 5 is also shown. Panel locking mechanisms and connecting infrastructure to the streetlights 4 have been omitted for clarity.

The piezoelectric aspects of the proposed photopiezoelectric panel converts kinetic energy in the form of compressive forces and vibrations into electrical energy. PZT is capable of withstanding pressures of up to 250 MPa (250×106 N/m2) without breaking, however for practical applications, the pressures experienced should be less than about 20 percent of this value as depolarization occurs at pressures between 20 to 30 percent of the material's mechanical limit.

When utilized in a photopiezoelectric panel application, the PZT will experience ground pressure that the PZT will convert into usable electrical energy. A measure of the ground's potential mobility, ground pressure is the pressure exerted on the ground by the tires of motorized vehicles or the feet of a walking person. For a 1.8-meter medium build human male, walking exudes a ground pressure of 55 kPa (8 psi). Accordingly, the practical applications material mechanical properties threshold for a single sheet of PZT is not exceeded: the invention can safely withstand ground pressure created by approximately 909 medium build human males. And, a typical passenger car exhibits a ground pressure of 205 kPa (30 psi), so that a single PZT sheet is capable of accommodating the ground pressure of approximately 243 passenger vehicles. As such, it can be concluded that the material properties of PZT are well-suited for applications involving photopiezoelectric panels.

It has been found that exposing PZT to repeated loadings of a 50 kg weight meant to simulate the ground pressure created by human footsteps takes approximately 800 steps to produce a 1-volt charge in an assumed 1 amp hour battery. When this experiment was implemented in a populated area with an average of two footsteps being registered per second, it took approximately 80 minutes to register 9,600 steps, enough to generate 12 volts of electricity. The amount of electrical energy produced by this method is directly related to population density and photopiezoelectric panel density, as the higher these parameters are, the higher the potential electrical energy generation.

Figure 2:
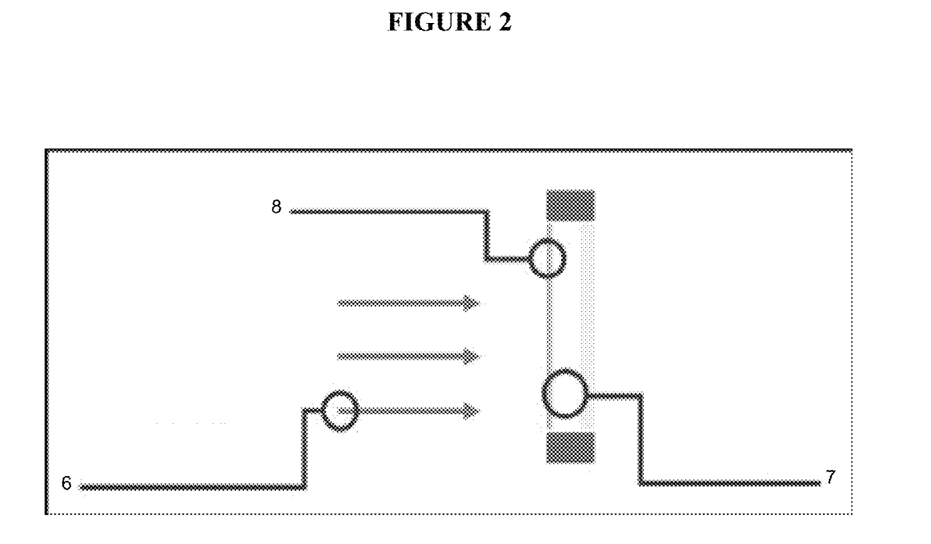
FIG. 2 is a Piezoelectric Transducer.

The PZT material will also function as a vibration-powered generator by converting vibrational kinetic energy from sources such as sound pressure waves 6 into electrical energy with the inclusion of a transducer 7 fabricated from a piezoelectric diaphragm 8 as seen in FIG. 2.

Potential electrical power generation by means of vibrational energy conversion is directly related to the direction of vibrational wave propagation, be they longitudinal, transverse, flexural, or torsional vibrations. Different PZT shapes will respond to varying degrees to different directions wave propagation, and the important parameter to consider in this application of a piezoelectric resonator is meters per millimeter which in this instance is defined as the number of meters of electromagnetic wavelength for the fundamental mode of vibration along any dimension divided by that dimension expressed in millimeters. When dealing with this quantity, the wave-constant term is recommended and is applicable to resonators derived from any crystal, not just quartz or PZT.

Figure 3:
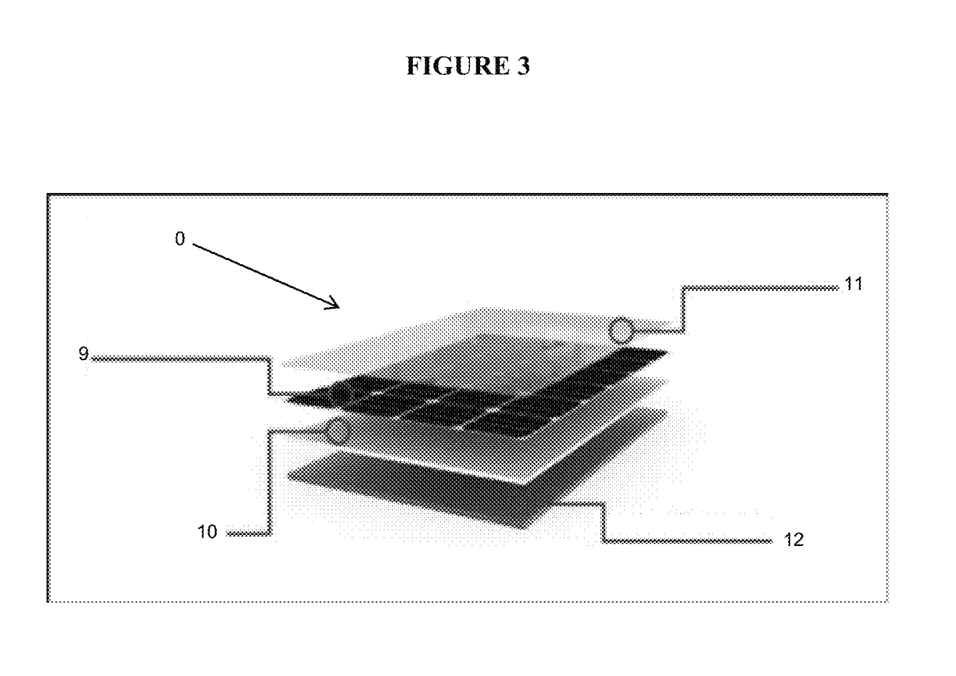
FIG. 3 is a Photopiezoelectric Panel Exploded View.

The inventive panel solves many design constraints formally unaddressed. Firstly, as shown an exemplary embodiment in FIGS. 3 and 6, the invention comprises a photovoltaic cell 9 capable of generating approximately 12 watts placed above the PZT layer 10. PZT takes the appearance of a white to off-white solid, meaning sunlight will not pass through the material. Accordingly, the PZT layer (or sheet) 10 resides below the photovoltaic cell 9. Secondly, the photopiezoelectric panel 0 is intended to be installed on sidewalks and other surfaces that experience traffic in the form of pedestrian footsteps and lightweight rolling objects and vehicles, so the photovoltaic cell 9 must be protected from such traffic while still capable of receiving sunlight unobstructed. To accomplish this, a layer of adaptive tempered glass 11 is employed above the photovoltaic cell 9. In one embodiment, the tempered glass 11 features a Class 4 ANSI FM 4473 Hail Rating, a Class F ASTM D3161 Wind Rating, and a Class A UL 790 Fire Rating with a weatherization life expectancy of approximately 30 years. For the photovoltaic and piezoelectric mechanisms to transmit the electrical energy they produce, a modular grid network 3, as shown in FIG. 1, is installed below the panel sidewalk 5 to allow for the photopiezoelectric panels to be easily installed and replaced as needed. To connect the photopiezoelectric panels 0 to this modular grid network 3, a connector plate 12 is used as the final layer of the photopiezoelectric panel 0 with the purpose of acting as the interface between the photovoltaic and piezoelectric mechanisms and the modular grid network 3.

Figure 4:
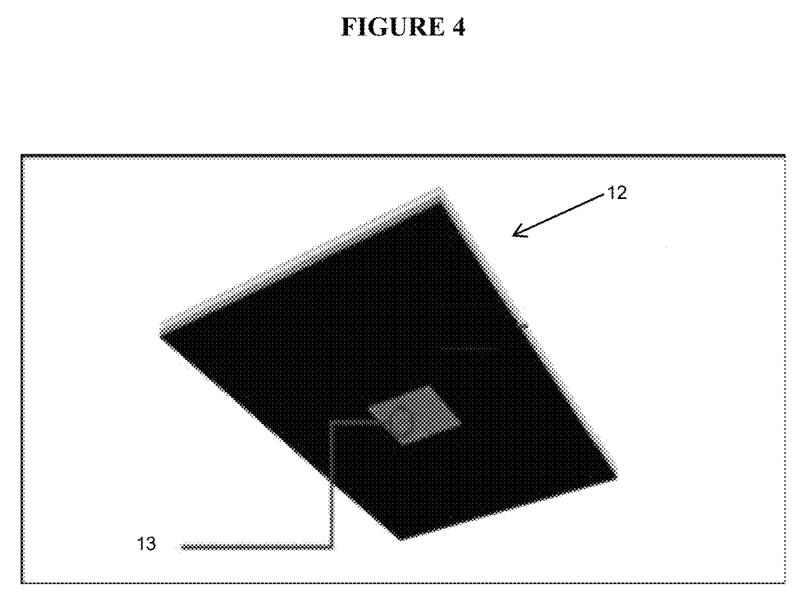
FIG. 4 is a Photopiezoelectric Panel Connector Plate Detail.

In one embodiment, the portion of the connector plate 12 that interfaces with the modular grid network 3 is to have a locking mechanism that fastens the photopiezoelectric panel 0 to the modular grid network 3 to prevent its unwanted or unintended translation or removal. FIG. 4 shows the underside of the photopiezoelectric panel 0 with the conducting contacts including a conducting pad 13 visible, the panel locking mechanism has been omitted for clarity.

Figure 5:
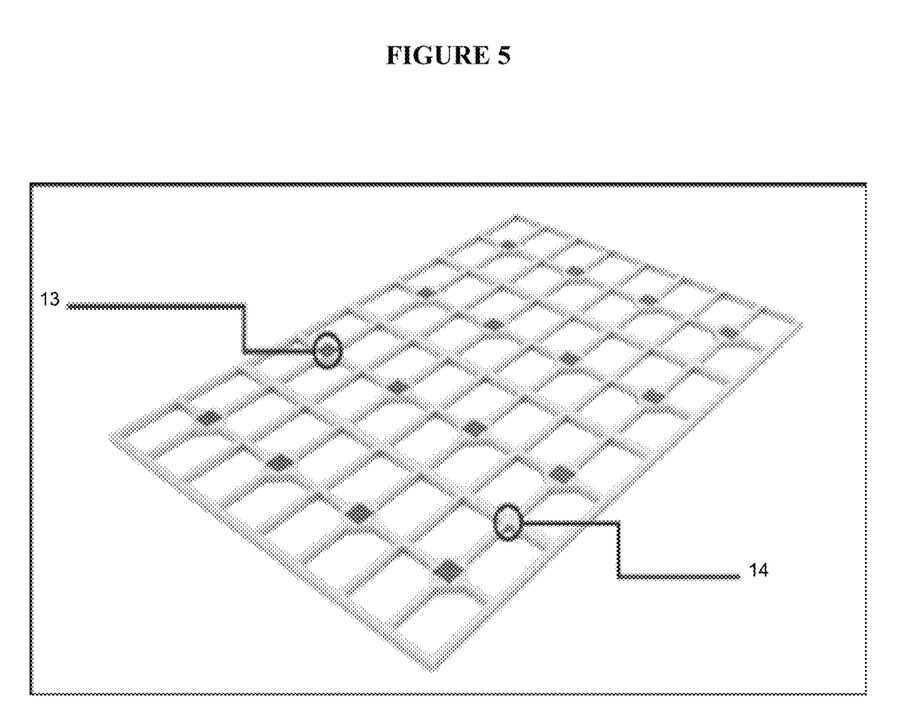
FIG. 5 is a Photopiezoelectric Panel Modular Grid Network.

In the embodiments in which the photopiezoelectric panel 0 is designed to interface with a modular grid network 3 via the connector plate 12, the modular grid network 3 comprises a locking mechanism (FIG. 4) to fasten each installed photopiezoelectric panel 0 to itself to prevent the panel's unwanted translation or removal. The modular grid network 3 is designed to allow for rapid installation and removal of not only photopiezoelectric panels 0, but additional grid network segments as well, using an interlocking mechanism to fasten each grid network segment to one another. FIG. 5 illustrates the modular grid network, with the conducting pad 13 shown and the location of the interlock of one set of panels 14. When the locking mechanism is fully engaged, the photopiezoelectric panel connector plate should be mated flush with the modular grid network.

The result of layering tempered glass on top of a photovoltaic cell, PZT sheet, and connector plate is a photopiezoelectric panel. In one embodiment, the dimensions of each photopiezoelectric panel is 8 inches by 12 inches (20.32 cm by 30.48 cm, for a total surface area of 96 square inches (619.35 $cm^2$). The thickness of each photopiezoelectric panel is estimated to be approximately 0.375 inches (0.9525 cm) however this dimension does not account for the panel locking mechanism or the transducer assembly required to correctly capture and harness vibrational energies and convert them into usable electrical energy. FIG. 6 displays a fully assembled photopiezoelectric panel ready for installation.

Example 1

Examining a strip of photopiezoelectric panel-integrated sidewalk that is four panels wide by 12 panels in length totaling 48 panels and assuming that each panel experiences direct sunlight in addition to two footsteps per second from an adult human ranging in weight between 50 and 60 kg, and neglecting the sunlight obstructions created by the passing pedestrians, electricity generation values can be estimated. With the level of traffic flow required for each panel to receive two footsteps per second on average, each of the 48 panels would generate approximately 12 watts of electricity per 80 minutes which averages out to approximately 0.15 watts per minute. Compounded with each panel producing 0.15 watts per minute for a combined electrical power generation of 7.2 watts per minute or 432 watts per hour, the result is a configuration which generates a considerable amount of electrical energy. This figure even assumes that no electric energy is generated from vibrational and heat conversion.

The average wattage of a streetlight is approximately 80 watts, so on an hourly basis the photovoltaic cell aspects of the 48 panels in question are enough to satisfy the hourly power requirements of approximately 5 and a half streetlights. At a spacing of 34 meters (111.55 feet) for local roads noted as a high Pedestrian Conflict Area, this section of paneling can power its adjacent streetlight while simultaneously storing enough electrical power into a battery bank to power said streetlight for its entire night operation duration.

For the purpose of understanding the PHOTOPIEZOELECTRIC PANELS, references are made in the text to exemplary embodiments of an PHOTOPIEZOELECTRIC PANELS, only some of which are described herein. No limitations on the scope of the invention are intended by describing these exemplary embodiments. One of ordinary skill in the art will readily appreciate that alternate but functionally equivalent components, materials, designs, and equipment may be used. The inclusion of additional elements may be deemed readily apparent and obvious to one of ordinary skill in the art. Specific elements disclosed herein are not to be interpreted as limiting, but rather as a basis for the claims and as a representative basis for teaching one of ordinary skill in the art to employ the present invention.

Reference throughout this specification to features, advantages, or similar language does not imply that all the features and advantages that may be realized should be or are in any single embodiment. Rather, language referring to the features and advantages is understood to mean that a specific feature, advantage, or characteristic described in connection with an embodiment is included in at least one embodiment. Thus, discussion of the features and advantages, and similar language, throughout this specification may, but do not necessarily, refer to the same embodiment.

The invention claimed is:

1. An electricity generating panel comprising:
    a) a first layer, said first layer being capable of converting solar energy into electricity;
    b) a second layer, said second layer being capable of converting vibrational energy into electricity and being disposed below said first layer;
    c) a cover layer situated on top of said first layer and being capable of protecting said first layer from shock, water, and heat damage;
    d) a modular grid network; and
    e) a connector plate that interfaces between said first layer and said modular grid network and said second layer and said modular grid network, so that said connector plate transmits said solar energy and said vibrational energy to said modular grid network and wherein said connector plate further comprises a locking mechanism that fastens said first layer, second layer, and cover layer to said modular grid network.

2. The electricity generating panel of claim 1, wherein said first layer comprises photovoltaic cells.

3. The electricity generating panel of claim 1, wherein said second layer comprises piezoelectric crystals.

4. The electricity generating panel of claim 3, wherein said piezoelectric crystals comprise PZT.

5. The electricity generating panel of claim 1 wherein said cover layer comprises tempered glass.

6. The electricity generating panel of claim 1 wherein said modular grid network further comprises an interlocking connection mechanism so that said modular grid network is capable of rapid installation.

7. The electricity generating panel of claim 1 further comprising a mechanism capable of converting ambient ground and subterranean heat to electricity.

8. A network of electricity generating panels comprising:
    a) at least two electricity generating panels comprising photovoltaic cells and piezoelectric crystals, wherein said photovoltaic cells and piezoelectric crystals produce electricity;

b) a panel connecting mechanism, said panel connecting mechanism capable of removably connecting said at least two electricity generating panels to another of said at least two electricity generating panels; and c) a modular grid network that is connected to the ambient electricity grid so that said modular grid network is capable of transferring said photovoltaic cells and piezoelectric crystals produced electricity to the ambient electricity grid and wherein said modular grid network comprises at least two network segments that are removably connected.

9. The network of claim 8 comprising a plurality of said at least two electricity generating panels so that said plurality comprises a sidewalk.

10. The network of claim 8 wherein said modular grid network is capable of transferring said photovoltaic cells and piezoelectric crystals produced electricity to a streetlight.

* * * * *